US006895352B2

(12) United States Patent
Josselson et al.

(10) Patent No.: US 6,895,352 B2
(45) Date of Patent: May 17, 2005

(54) SIMULTANEOUS RAPID OPEN AND CLOSED LOOP BODE PLOT MEASUREMENT USING A BINARY PSEUDO-RANDOM SEQUENCE

(75) Inventors: Robert H. Josselson, Fort Wayne, IN (US); Joe P. Predina, Fort Wayne, IN (US)

(73) Assignee: ITT Manufacturing Enterprises, Inc., Wilmington, DE (US)

( * ) Notice: Subject to any disclaimer, the term of this patent is extended or adjusted under 35 U.S.C. 154(b) by 19 days.

(21) Appl. No.: 10/094,965

(22) Filed: Mar. 12, 2002

(65) Prior Publication Data

US 2003/0176983 A1 Sep. 18, 2003

(51) Int. Cl.[7] .................................................. G01B 5/30
(52) U.S. Cl. ........................... 702/108; 702/75; 360/75
(58) Field of Search .......................... 702/108, 18, 75; 318/561; 179/1 P; 360/75

(56) References Cited

U.S. PATENT DOCUMENTS

| 4,067,060 A | 1/1978 | Poussart et al. ............. 702/110 |
| 4,093,988 A | 6/1978 | Scott .......................... 364/484 |
| 4,306,113 A | * 12/1981 | Morton ....................... 179/1 D |
| 4,527,116 A | 7/1985 | Sorba et al. ............. 324/76.19 |
| 5,406,496 A | 4/1995 | Quinn ......................... 364/484 |
| 5,446,648 A | 8/1995 | Abramovitch et al. ....... 364/128 |
| 5,517,594 A | 5/1996 | Shah et al. .................. 392/416 |
| 5,687,733 A | 11/1997 | McKown ..................... 122/692 |
| 5,880,415 A | 3/1999 | Colby et al. ................. 187/393 |
| 5,909,661 A | 6/1999 | Abramovitch et al. ....... 702/191 |
| 5,929,400 A | 7/1999 | Colby et al. ................. 187/393 |
| 6,204,988 B1 | 3/2001 | Codilian et al. ............... 360/75 |
| 6,259,221 B1 | 7/2001 | Yutkowitz .................... 318/561 |
| 6,278,898 B1 | 8/2001 | Shah ........................... 700/29 |
| 6,281,650 B1 | * 8/2001 | Yutkowitz .................... 313/561 |
| 2002/0019715 A1 | * 2/2002 | Cohen et al. .................. 702/75 |
| 2003/0176983 A1 | * 9/2003 | Josselson et al. ............ 702/108 |

FOREIGN PATENT DOCUMENTS

EP          1345102 A1  *  9/2003    ............ G05B/23/02

OTHER PUBLICATIONS

European Appl. 1 180 734 A (Kollmorgen Corp.) dated Feb. 20, 2002.
European Search Report dated May 16, 2003 issued in EP 03005240.1–2206.

* cited by examiner

Primary Examiner—John Barlow
Assistant Examiner—Victor J Taylor
(74) Attorney, Agent, or Firm—Davidson Berquist Jackson & Gowdey LLP

(57) ABSTRACT

A simultaneous rapid open and closed loop bode measurement plot is described in which testing of the servo controlled instrument occurs under closed loop conditions using a binary pseudo-random sequence. The binary pseudo-random sequence is injected into the servo while the system under test is operating closed loop in order to generate bode plots for open loop and closed loop conditions. The present invention provides measurement results approximately 1,000 times faster than a swept sinusoid approach and provides superior dynamic range as compared to random white noise test input sources.

21 Claims, 1 Drawing Sheet

SIMULTANEOUS RAPID OPEN AND CLOSED LOOP BODE PLOT MEASUREMENT USING A BINARY PSEUDO-RANDOM SEQUENCE

The inventions claimed herein were made with support from the United States government, which has certain rights in the inventions claimed.

FIELD OF THE INVENTION

This invention relates to servo control mechanisms and methods of operating servo controlled mechanisms.

BACKGROUND AND SUMMARY OF THE INVENTION

The present invention relates to the control of servo loops and, in the preferred embodiment, the simultaneous rapid open and closed loop control measurements obtained using a binary pseudo-random sequence.

The use of a binary pseudo-random sequence to test an electrical or mechanical system for the purpose of computing its power spectrum by discrete fast Fourier transform (DFT) techniques is well known, for example, as described in U.S. Pat. No. 4,093,988. In accordance with U.S. Pat. No. 4,093,988, the properties of binary pseudo-random noise and the discrete fast Fourier transforms are utilized to, in effect, simultaneously inject a closely spaced set of equal amplitude sign waves over a prescribed frequency range into the system under test and to separate the response of the output. For its discussion of binary pseudo-random sequences and filters therefore, and discrete fast Fourier transform techniques employed therein, the U.S. Pat. No. 4,093,988 patent is incorporated herein by reference. Still, the '988 patent does not describe the use of binary pseudo-random sequences within feedback devices, for simultaneous rapid open and closed loop bode plot measurement in servo loops, or in general, any loop calibration application.

Within the context of servo loop control, existing techniques to generate a bode plot measurement inject a swept sinusoid, random white noise, or a chirp into the system under test in order to obtain the bode plot measurements. A method and apparatus for tuning motion control system parameters using random noise excitation, for example, is described in Yutkowitz, U.S. Pat. No. 6,259,221. In the '221 patent, the system comprises a random noise signal generator in communication with the servo controller, and a frequency response analyzer in communication with the servo controller. The random noise signal generator is configured to provide a random noise signal to the servo controller during controlled motion of the actuator. The frequency response analyzer is configured to generate frequency responses for the random noise signal. The '221 patent does not specify the type of random noise used beyond the generalities, "white noise," "pink noise," or "band limited white noise signals."

Thus, the previous binary pseudo-random sequence test apparatus, such as U.S. Pat. No. 4,093,988, uses only the output measurement of a system under test and cannot generate an open loop or closed loop bode plot, which would require both input and output of the system under test. Other devices, such as U.S. Pat. No. 6,259,221, describe the calculation of open loop and closed loop responses, but fail to recognize the value of binary pseudo-random sequences used to generate a bode plot.

The present invention injects a binary pseudo-random sequence, using both the input and the output of the system under test to generate bode plots. The invention has the advantage of generating the open and closed loop bode plots while the system under test is operating closed loop. This allows real-time bode plots to be computed for in-situ applications, such as on-orbit applications, while simultaneously maintaining control of the system under test. The advantages of the present invention are significant. The invention produces measurement results approximately 1,000 times faster than a swept sinusoid approach and has superior dynamic range as compared to using random white noise as a test input source.

DETAILED DESCRIPTION OF A PRESENTLY PREFERRED EMBODIMENT

Figure 1:
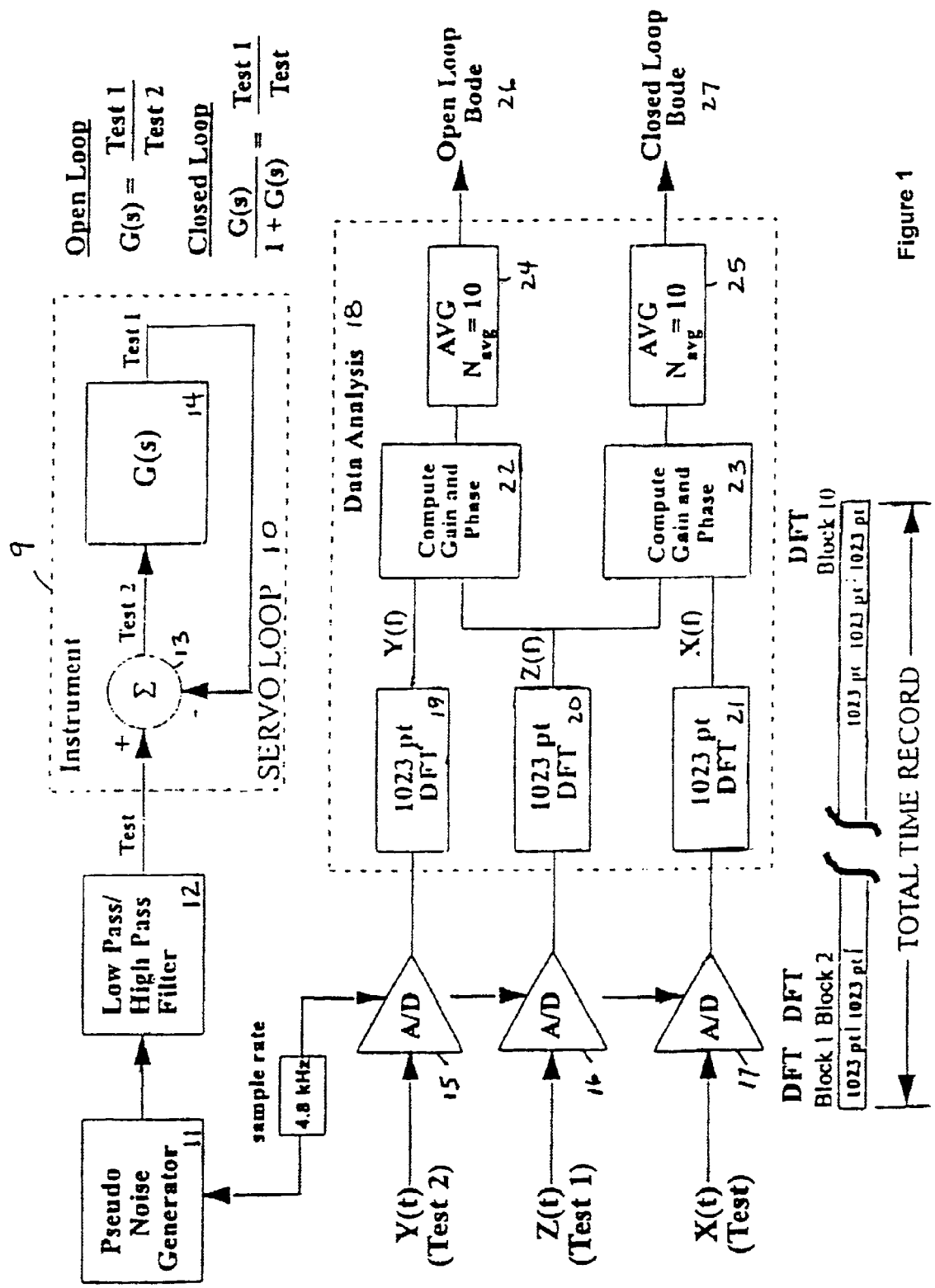
FIG. 1 is a schematic block diagram of an example embodiment of the present invention.

FIG. 1 illustrates a block diagram of the presently preferred embodiment to the present invention. The servo system under test 9 is operating with the servo loop 10 in closed loop. A binary pseudo-random sequence is applied to the servo by the combination of the pseudo-random noise generator 11 inputting to the band pass filter 12. In the example embodiment, the binary pseudo-random sequence consists of ten repeated blocks of a 1023 bit sequence, which is passed through the band pass filter, i.e., band pass filter 12, before injection into the servo 9. Simultaneously sampled measurements are taken at three points in the servo loop 10, "test," "test 1," and "test 2."

The discrete fast Fourier transform of each 1,023 point block is then computed in the data analysis section 18. As noted in FIG. 1, the plant G(s) 14 in the open loop condition is:

$$G(s) = \frac{test1}{test2}$$

In the closed loop condition, G(s) is $$\frac{G(s)}{1+G(s)} = \frac{test1}{test}$$

Assuming that X(t), Y(t) and Z(t) denote the discrete fast Fourier transforms of a 1,023 point block of the signals test, test1, and test2, respectively, then the open loop bode is computed from the gain and phase of Z/Y by averaging over the ten blocks. The closed loop bode is similarly computed from Z/X or can be computed directly from the quantity Z/Y as G/(1+G) where G equals Z/Y. Of course, numbers greater or less than the ten blocks discussed can be employed in alternative embodiments.

Thus, the test2, test1, and test signals are input into, respectively, A to D converters 15, 16, and 17, the output of which are input to the data analysis block 18 via 16-bit data lines. In the data analysis block 18, digital fast Fourier transforms operations are performed on the test2, test1, and test signals at blocks 19, 20, and 21. The output of the DFT blocks 19–21 are input, as appropriate, to gain and phase blocks 22 and 23 such that the open loop bode result 26 from the computer gain and phase block 22 and average computation block 24 is derived from the signals Z(f) and Y(f), respectively referring to the test1 and test2 transforms. Similarly, the gain and phase bloc 23 and average block 25 yield the closed loop bode result 27 using the Z(f) and X(f) transforms of, respectively, test1 and test.

The programmable band pass filter 12 allows the bode plots to be generated in distinct sub-octave frequency bands to eliminate aliased signal errors in the subsequent DFT processing in blocks 19–21. The distinct sub-octave frequency bands can later be concatenated to produce a continuous bode plot over the entire frequency range of interest. Segmenting into bands also allows different test signal amplitudes to be used for each band, optimizes the signal-to-noise ratio of the measurement, and prevents circuit saturation.

Because each spectral line generated from the 1,023 bit pseudo-random noise sequence is at the exact center of the 1,023 point discrete fast Fourier transform channels, all 1,023 spectral lines are processed with total orthogonality relative to each other. The DFT guarantees this because all other spectral lines other than the channel center line will coincide with a "zero" of the sinX/X shaped DFT response. This produces a considerably superior measurement over techniques that use random noise generators other than pseudo-random noise sequence synced to a DFT.

The present invention has application in any embedded system bode plot generation system, for example, on in-situ self-testing of any servo control mechanisms. One example in-situ system may be an on-orbit servo control mechanism where control of the servo may be maintained while the servo is under test.

Other applications that may employ the present invention to advantage are test equipment of any sort such as dynamic signal and FFT analyzers. Thus, fast transfer function measurements performed by network analyzers requiring simultaneous measurement of gain and phase will be advantaged by application of the present invention therein.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What is claimed is:

1. A system under test, comprising:
   a servo controlled mechanism having a feedback loop,
   a Bode plot generation system embedded in the feedback loop to simultaneously provide both open loop and closed loop Bode plots, said generation system including a pseudo-random noise generator to inject a pseudo-random sequence to the feedback loop while the feedback loop is in a closed condition during test;
   a sub-octave band pass filter enabling the Bode plots to be generated in distinct sub-octave frequency bands, and
   a discrete fast Fourier transform analyzer wherein spectral lines defined by the pseudo-random sequence are synchronized with channels of a discrete fast Fourier transform of the analyzer.

2. A system as in claim 1 wherein the Bode plot generation system tests both an input and an output of the feedback loop to provide the open and closed loop Bode plots based on signals from both the input and the output of the feedback loop.

3. A system as in claim 1 wherein the Bode plot generation system tests an input to the feedback loop, a signal representative of a feedback-modified input to the feedback loop, and an output from the feedback loop to generate the open and closed loop Bode plots.

4. A system as in claim 1 wherein the servo controlled mechanism includes a summing device in the feedback loop, and wherein the Bode plot generation system tests an input to the summing device, an output to the summing device, and an output of the feedback loop to provide the open and closed loop Bode plots based the input to the summing device, the output to the summing device, and the output of the feedback loop.

5. A system as in claim 4 wherein the Bode plot generation system includes a data analysis utility to perform discrete Fourier analysis on digitized versions of the input to the summing device, the output to the summing device, and the output of the feedback loop.

6. A system as in claim 5 wherein the data analysis utility further calculates:
   the open loop Bode plot by dividing the digitized version of the output of the feedback loop by the digitized version of the output of the summing device, and
   the closed loop Bode plot by dividing the digitized version of the output of the feedback loop by the digitized version of the input of the summing device.

7. A system as in claim 1 wherein the Bode plot generation system operates to provide the open loop and closed loop Bode plots while the servo controlled mechanism simultaneously maintains servo control of the system under test.

8. A method, comprising the steps of:
   servo controlling a mechanism having a feedback loop,
   testing signals embedded in the feedback loop simultaneously while servo-controlling the mechanism;
   generating a pseudo random sequence through a sub-octave band pass filter, and defining spectral lines;
   injecting the pseudo-random sequence into the feedback loop while the loop is closed during said testing; and
   generating open loop and closed loop Bode plots in distinct sub-octave frequency bands using discrete fast Fourier transforms having channels synchronizing with the spectral lines.

9. A method as in claim 8 wherein the step of testing includes testing both an input and an output of the feedback loop to provide the open and closed loop Bode plots based on signals from both the input and the output of the feedback loop.

10. A method as in claim 8 wherein the step of testing includes testing an input to the feedback loop, a signal representative of a feedback-modified input to the feedback loop, and an output from the feedback loop to generate the open and closed loop Bode plots.

11. A method as in claim 8 further including the step of:
    summing in a summing device in the feedback loop an input to the summing device, an output to the summing device, and an output of the feedback loop;
    creating digitized versions of the input to the summing device, the output to the summing device, and the output of the feedback loop; and
    calculating the open loop and closed loop Bode plots based on the digitized versions of the input to the summing device, the output to the summing device, and the output of the feedback loop.

12. A method as in claim 11 further including the step of performing discrete Fourier analysis on the digitized versions of the input to the summing device, the output to the summing device, and the output of the feedback loop.

13. A method as in claim 12 wherein the step of calculating further includes:
    calculating the open loop Bode plot by dividing the digitized version of the output of the feedback loop by the digitized version of the output of the summing device, and calculating the closed loop Bode plot by dividing the digitized version of the output of the feedback loop by the digitized version of the input of the summing device.

14. Testing apparatus for an servo-controlled instrument having a servo input signal, a instrument output signal, and a feedback error compensated signal, comprising:

a test signal generator to inject a pseudo random noise sequence as a test signal into the instrument as the servo input signal, the servo input signal defining spectral lines; and test signal acquisition circuitry to receive values for the servo input signal, the instrument output signal and the feedback error compensated signal in closed loop conditions while the test signal is injected as the servo input signal and while the instrument remains under servo control, and to compute in real-time a correction function for the instrument in accordance with the acquired values;

a sub-octave band pass filter to enable the Bode plots to be generated in distinct sub-octave frequency bands; and a discrete fast Fourier transform processor having channels centered on said spectral lines.

15. A method as in claim 14 wherein the test signal generator also includes a filter to receive and process the pseudo random noise sequence and injects an output signal from the filter as the test signal.

16. A method as in claim 15 wherein the correction function includes Bode plots and wherein the filter is a programmable to allow the Bode plots to be generated in distinct sub-octave frequency bands.

17. A method as in claim 14 wherein the test signal acquisition circuitry includes:

digitizers to receive and digitize the values for the servo input signal, the instrument output signal and the feedback error compensated signal in the closed loop conditions while the test signal is injected as the servo input signal;

Fourier transformers to convert the values for the servo input signal, the instrument output signal and the feedback error compensated signal in the closed loop conditions while the test signal is injected as the servo input signal into frequency domain values for the servo input signal, the instrument output signal and the feedback error compensated signal; and data analyzers to calculate the correction function to include an open loop correction function and a closed loop correction function in accordance with the frequency domain values.

18. A method as in claim 17 wherein:

the closed loop correction function is calculated according to a division of the frequency domain values of the instrument output signal by the servo input signal, and the open loop correction function is calculated according to a division of the frequency domain values of the instrument output signal by the feedback error compensated signal.

19. A method as in claim 14 wherein the test signal acquisition circuitry receive values for the servo input signal, the instrument output signal and the feedback error compensated signal in closed loop conditions by receiving sets of samples of the servo input signal, the instrument output signal and the feedback error compensated signal, respectively, in the closed loop conditions.

20. A method as in claim 14 wherein the test signal acquisition circuitry generates open loop and closed loop Bode plots generated in distinctive sub-octave frequency bands.

21. A method as in claim 20 wherein the test signal is injected as the servo input signal with different respective amplitudes for each of said sub-octave frequency bands.

* * * * *

UNITED STATES PATENT AND TRADEMARK OFFICE
CERTIFICATE OF CORRECTION

PATENT NO. : 6,895,352 B2
DATED : May 17, 2005
INVENTOR(S) : Josselson, Robert

It is certified that error appears in the above-identified patent and that said Letters Patent is hereby corrected as shown below:

Column 1,
Line 29, should be corrected to read -- sine waves -- instead of "sign waves"

Column 3,
Line 14, should be corrected to read -- are processed -- instead of "arc processed"

Signed and Sealed this

Nineteenth Day of July, 2005

JON W. DUDAS
*Director of the United States Patent and Trademark Office*